(12) United States Patent
Han et al.

(10) Patent No.: US 12,232,378 B2
(45) Date of Patent: Feb. 18, 2025

(54) DISPLAY PANEL, METHOD FOR MANUFACTURING THE SAME, AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Linhong Han, Beijing (CN); Yang Zhou, Beijing (CN); Yi Zhang, Beijing (CN); Tinghua Shang, Beijing (CN); Shikai Qin, Beijing (CN); Pengfei Yu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 432 days.

(21) Appl. No.: 17/639,033

(22) PCT Filed: Dec. 21, 2020

(86) PCT No.: PCT/CN2020/138069
§ 371 (c)(1),
(2) Date: Feb. 28, 2022

(87) PCT Pub. No.: WO2022/133666
PCT Pub. Date: Jun. 30, 2022

(65) Prior Publication Data
US 2023/0165079 A1    May 25, 2023

(51) Int. Cl.
*H10K 59/131*    (2023.01)
*H10K 59/12*    (2023.01)
*H10K 59/80*    (2023.01)

(52) U.S. Cl.
CPC ....... *H10K 59/131* (2023.02); *H10K 59/1201* (2023.02); *H10K 59/8791* (2023.02)

(58) Field of Classification Search
CPC ............. H10K 59/131; H10K 59/1201; H10K 59/8791
(Continued)

(56) References Cited

U.S. PATENT DOCUMENTS

2010/0283955 A1    11/2010    Kim et al.
2020/0098843 A1*   3/2020    Jeon ..................... H10K 59/131
(Continued)

FOREIGN PATENT DOCUMENTS

CN    108831910 A    * 11/2018    ......... H01L 27/3276
CN    109147574 A    1/2019
(Continued)

*Primary Examiner* — Igwe U Anya
(74) *Attorney, Agent, or Firm* — HOUTTEMAN LAW LLC

(57) ABSTRACT

A display panel and a display apparatus are provided; the display panel is divided into a display region and a non-display region at least partially surrounding the display region; a fan-out region is provided in the non-display region; the display panel includes a substrate and a first power trace provided on the substrate; a first portion of the first power trace is provided in the fan-out region and configured to transmit a first power signal; and the first portion includes: a sheet-shaped trace proximal to an edge of the display panel, and a plurality of stripe-shaped traces spaced apart from one another and extending from the sheet-shaped trace toward the display region. According to the present disclosure, the first power trace in the fan-out region is configured to include the plurality of strip-shaped traces.

18 Claims, 10 Drawing Sheets

(58) Field of Classification Search
USPC .......................................................... 257/91
See application file for complete search history.

(56) References Cited

U.S. PATENT DOCUMENTS

2021/0225981 A1* 7/2021 Yi ........................ H10K 59/131
2022/0320242 A1* 10/2022 Han ................... H10K 59/8792

FOREIGN PATENT DOCUMENTS

| CN | 210092083 U | 2/2020 |
| CN | 111261686 A | 6/2020 |
| CN | 112051691 A | 12/2020 |

* cited by examiner ns, good portability and the like, and represent a major
DISPLAY PANEL, METHOD FOR MANUFACTURING THE SAME, AND DISPLAY APPARATUS

TECHNICAL FIELD

Embodiments of the present disclosure are directed to, but not limited to, the field of display technology, and in particular, to a display panel, a method for manufacturing the same, and a display apparatus.

BACKGROUND

Flexible displays have many advantages such as impact resistance, high anti-shock capability, light weight, compactdevelopment trend in the future. A flexible display includes a display panel and a cover plate, and a non-display region of the display panel is provided with power traces configured to provide power signals to a display region so as to display images or the like. The cover plate is bonded onto the display panel, and ink is provided on edges of the cover plate to cover the non-display region. For the sake of preventing the ink from entering the display region, a bonding tolerance has to be considered when the cover plate is bonded onto the display panel, and as such, the power traces in the non-display region will not be completely covered by the ink on the cover plate.

SUMMARY

The present disclosure provides a display panel, a method for manufacturing the same, and a display apparatus.

In a first aspect, the display panel includes a display region and a non-display region at least partially surrounding the display region, the non-display region is provided with a fan-out region, the display panel includes a substrate and a first power trace provided on the substrate, the first power trace includes a first portion provided in the fan-out region, and the first portion includes a sheet-shaped trace proximal to an edge of the display panel and a first subportion extending from the sheet-shaped trace toward the display region; and within a unit area, an area of an orthographic projection of the first sub-portion on the substrate is smaller than an area of an orthographic projection of the sheet-shaped trace on the substrate.

In one embodiment, the display region includes a plurality of pixel units; the first sub-portion includes a plurality of strip-shaped traces spaced apart from one another; and the display panel further includes a plurality of transfer traces electrically connected between the plurality of strip-shaped traces and the plurality of pixel units, and the plurality of transfer traces are provided in the fan-out region.

In one embodiment, the plurality of pixel units include a plurality of pixel units arranged in a plurality of rows and columns; and each transfer trace of the plurality of transfer traces is electrically connected with a first power signal line of a respective column of pixel units of a plurality of columns of pixel units.

In one embodiment, the first portion further includes a bus bar provided on one side of the plurality of strip-shaped traces distal to the sheet-shaped trace, and the plurality of strip-shaped traces each are connected to the bus bar; and ends of the plurality of transfer traces distal to the display region each are electrically connected to the bus bar.

In one embodiment, at least one strip-shaped trace of the plurality of strip-shaped traces includes a first end portion adjacent to the bus bar, and an area of an orthographic projection of the first end portion on the bus bar becomes larger as the first end portion approaches the bus bar.

In one embodiment, at least one transfer trace of the plurality of transfer traces includes a second end portion adjacent to the bus bar, and an area of an orthographic projection of the second end portion on the bus bar becomes larger as the second end portion approaches the bus bar.

In one embodiment, a first oblique angle is formed between the first end portion of the strip-shaped trace and the bus bar; a second oblique angle is formed between the transfer trace and the bus bar; and an absolute value of an angle difference between the first oblique angle and the second oblique angle is less than 30°.

In one embodiment, a distance between every two adjacent strip-shaped traces of the plurality of strip-shaped traces is a distance between respective center lines of the two adjacent strip-shaped traces, and a difference of distances between at least two adjacent strip-shaped traces of the plurality of strip-shaped traces is no more than 10 μm.

In one embodiment, a distance between at least two adjacent strip-shaped traces is within a range from half a distance between at least two adjacent columns of pixel units among the plurality of pixel units arranged in the plurality of rows and columns to twice the distance between the at least two adjacent columns of pixel units.

In one embodiment, the display region further includes a plurality of data lines, and the fan-out region further includes a plurality of data line leads; orthographic projections of the plurality of data lines on the substrate are located between orthographic projections of a plurality of first power signal lines of the plurality of columns of pixel units on the substrate, respectively; the plurality of data lines are connected to a data signal line through the plurality of data line leads, respectively; and orthographic projections of the plurality of data line leads on the substrate partially overlap with orthographic projections of the plurality of strip-shaped traces and the sheet-shaped trace on the substrate.

In one embodiment, the substrate is flexible.

In a second aspect, in a method for manufacturing the display panel, the display panel is divided into a display region and a non-display region partially surrounding the display region, the non-display region is provided with a fan-out region, and the method for manufacturing the display panel includes: forming, on the substrate, the first power trace configured to transmit a first power signal, such that the first portion of the first power trace is provided in the fan-out region, and the first portion includes the sheet-shaped trace proximal to an edge of the display panel and a plurality of strip-shaped traces spaced apart from one another and extending from the sheet-shaped trace toward the display region.

In one embodiment, the method further includes: forming, in the fan-out region of the substrate, a plurality of transfer traces electrically connected with the first portion, the plurality of transfer traces being configured to be electrically connected with a plurality of pixel units of the display panel.

In a third aspect, the display apparatus includes: the display panel; and a cover plate, which is bonded onto the display panel, and edges of which are provided with a light shielding layer to cover the non-display region, wherein at least a portion of the first portion of the first power trace is not covered by the light shielding layer.

In one embodiment, the display apparatus further includes: a second power trace provided in the fan-out region and located at a position distal to the display region with respect to the first power trace, wherein the light shielding layer at least partially covers the second power trace.

BRIEF DESCRIPTION OF DRAWINGS

Accompanying drawings are provided for facilitating the understanding of the technical solutions provided in the present disclosure and constitute a part of the specification. These drawings are intended to explain the technical solutions provided in the present disclosure in conjunction with embodiments of the present disclosure, but should not be construed as limitations thereupon.

DETAILED DESCRIPTION OF EMBODIMENTS

Figure 1:
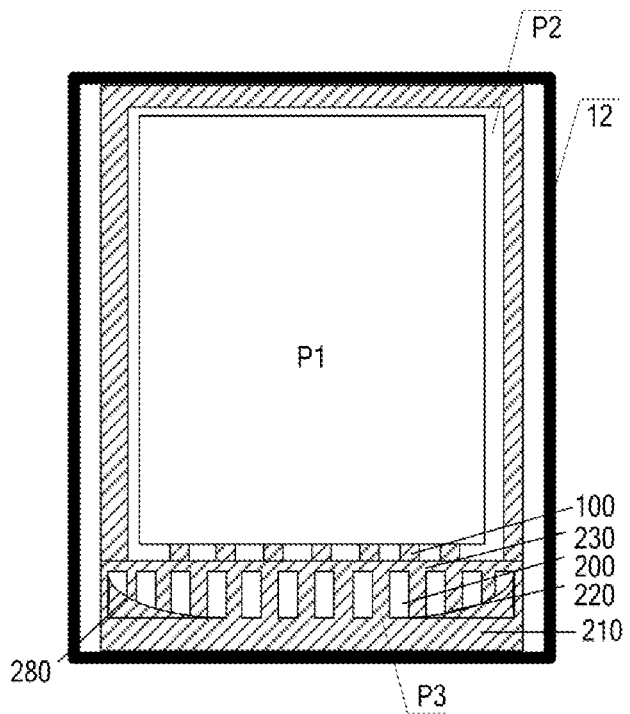
FIG. 1 is a top view of a display panel provided in one embodiment of the present disclosure.

While various embodiments have been described in the present disclosure, they have been presented by way of example rather than limitation. For a person skilled in the art, many more embodiments and implementations are possible within the scope contained in embodiments described in the present disclosure. Although many possible combinations of features have been illustrated in the drawings and discussed in the embodiments, numerous other combinations of the features disclosed herein are possible. Unless otherwise expressly limited herein, any features or elements of any embodiments may be used in conjunction with or in instead of any other features or elements of any other embodiments.

In addition, in describing representative examples of the present disclosure, the specification may have presented the method and/or process of the present disclosure as a particular sequence of steps. However, to the extent that the method or process does not rely on the particular sequence of steps set forth herein, the method or process should not be limited to the particular sequence of steps described. As understood by a person skilled in the art, other sequences of steps may be possible. Therefore, the particular sequence of the steps set forth in the specification should not be construed as limitations on the claims. In addition, the claims directed to the method and/or process of the present disclosure should not be limited to the performance of their steps in the written sequence, and a person skilled in the art will readily understand that the sequences may be varied and still remain within the spirit and scope of embodiments of the present disclosure.

Unless otherwise defined, technical terms or scientific terms used in embodiments of the present disclosure should have the ordinary meanings that could be understood by a person skilled in the art to which the present disclosure pertains. The words "first", "second", and the like used in embodiments of the present disclosure are not intended to indicate any order, quantity, or importance, but rather are used for distinguishing one element from another. The word "comprising", "comprises", "including", "includes" or the like means that the element or item preceding the word comprises the element or item listed after the word and the equivalent thereof, but do not exclude the presence of other elements or items. The word "connected", "coupled" or the like is not restricted to a physical or mechanical connection, but may include an electrical connection, whether direct or indirect. The words "upper", "lower", "left", "right" and the like are used merely to indicate relative positional relationships, and when the absolute position of the object being described is changed, these relative positional relationships may also be changed accordingly; and the objects being described may contact with each other directly or indirectly.

In the prior art, power traces are typically made of metal to improve display performance. However, since metal is prone to reflect light, the light reflected by the power traces uncovered by ink is visible to the naked eye, which affects the display effect.

Figure 2:
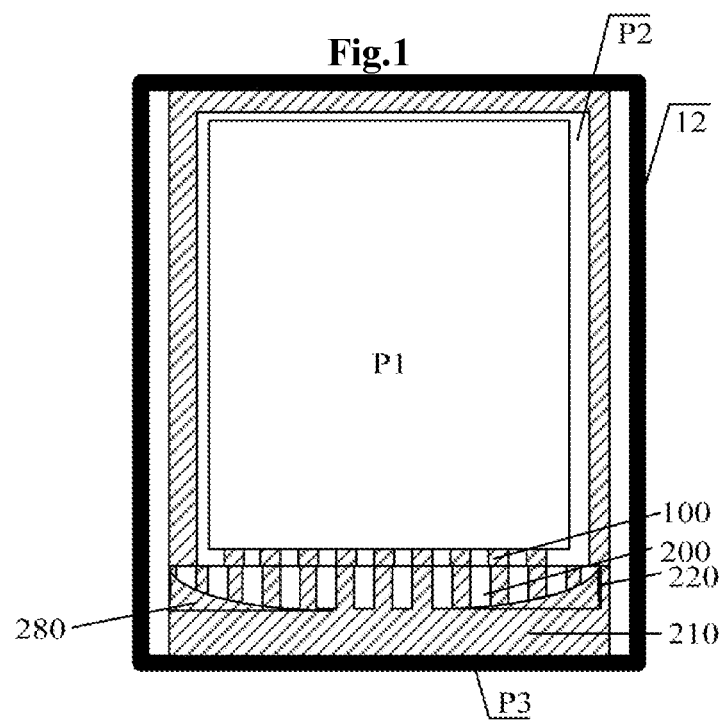
FIG. 2 is a top view of a display panel provided in one embodiment of the present disclosure.
Figure 3:
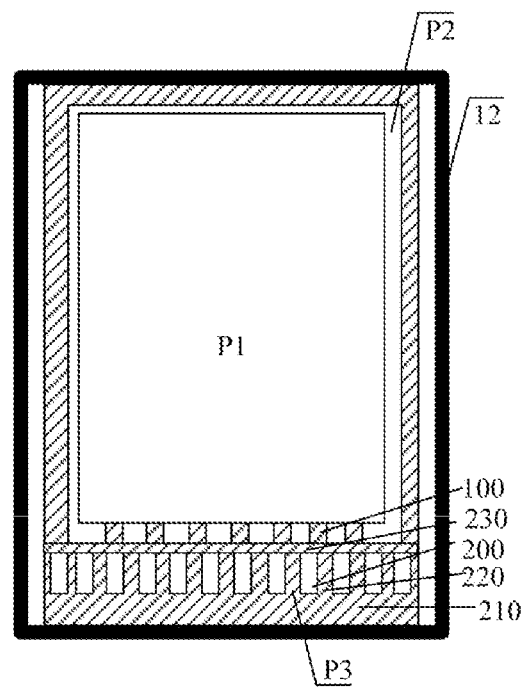
FIG. 3 is a top view of a display panel provided in one embodiment of the present disclosure.
Figure 4:
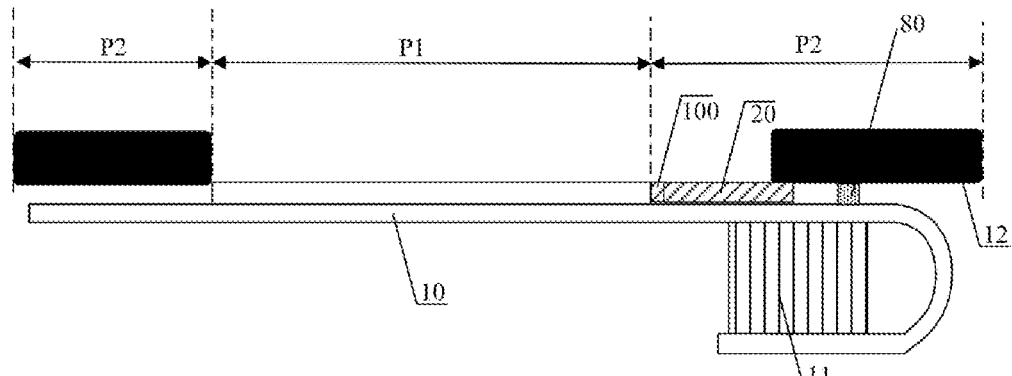
FIG. 4 is a side view of a display panel provided in one embodiment of the present disclosure.

In order to solve the above technical problem, the present disclosure provides a display panel, a method for manufacturing the same and a display apparatus, the detailed description of which is as follows:

FIG. 1 is a top view of a display panel provided in one embodiment of the present disclosure; FIG. 2 is a top view of a display panel provided in one embodiment of the present disclosure; FIG. 3 is a top view of a display panel provided in one embodiment of the present disclosure; and FIG. 4 is a sectional view of a display panel provided in one embodiment of the present disclosure. As shown in FIGS. 1 to 4, the display panel in these embodiments of the present disclosure is divided into a display region P1 and a non-display region P2 surrounding the display region P1; a fan-out region P3 is provided in the non-display region P2; the display panel includes a substrate 10 and a first power trace provided on the substrate 10; and a first portion 20 of the first power trace is provided in the fan-out region P3 and configured to transmit a first power signal, for example, a power signal VDD in the display panel. The first power trace is typically a film layer made of Titanium (Ti)/Aluminum (Al)/Titanium (Ti).

Figure 7:
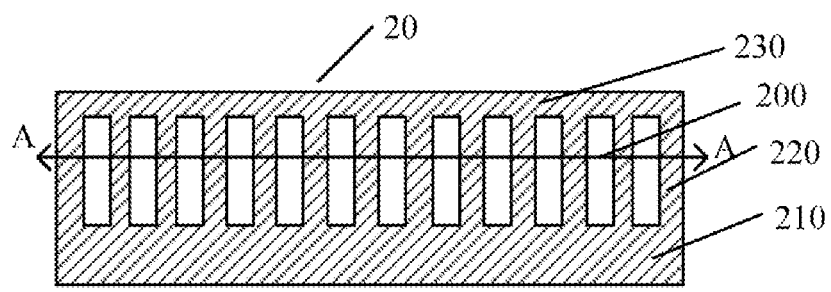
FIG. 7 is a top view of a first portion of a first power trace provided in one embodiment of the present disclosure.

As shown in FIG. 1, the first portion 20 of the first power trace in the present disclosure includes a sheet-shaped trace 210 proximal to an edge of the display panel, a plurality of strip-shaped traces 220 spaced apart from one another and extending from the sheet-shaped trace 210 toward the display region P1, and a bus bar 230 electrically connected with the plurality of strip-shaped traces 220. In this embodiment, the sheet-shaped trace 210, the plurality of strip-shaped traces 220 and the bus bar 230 may be integrally formed as a single piece, that is, may be prepared from a single piece of metal material using a patterning process. For example, the first portion 20 may be formed by forming a plurality of vias 200 in a single metal material layer using the patterning process, as shown in FIG. 7.

For example, the plurality of vias 200 thus formed may be parallel to one another, and accordingly, the plurality of strip-shaped traces 220 thus formed are also parallel to one another. A distance between every two adjacent strip-shaped traces 220 may be the same. As shown in FIG. 1, the display panel further includes a plurality of transfer traces 100, which are provided in the fan-out region P3, electrically connected with the bus bar 230, and configured to transfer a first power supply to pixel units in the display region P1. For example, when the display region P1 includes a plurality of pixel units arranged in a plurality of rows and columns, each of the plurality of transfer traces 100 is electrically connected to a respective column of pixel units, and configured to provide the first power supply to this column of pixel units.

In one embodiment, the sheet-shaped trace 210, the plurality of strip-shaped traces 220, the bus bar 230 and the plurality of transfer traces 100 may be integrally formed as a single piece, that is, may be prepared from a single piece of metal material using the patterning process.

It can be further seen from the display panel shown in FIG. 1 that respective lengths of the strip-shaped traces in corner regions 280 in the first portion of the first power trace of the display panel are shorter than those of strip-shaped traces in a region other than the corner regions 280. This is because the corner regions will be covered by a frame of the display panel and they will not cause any reflection.

Figure 20:
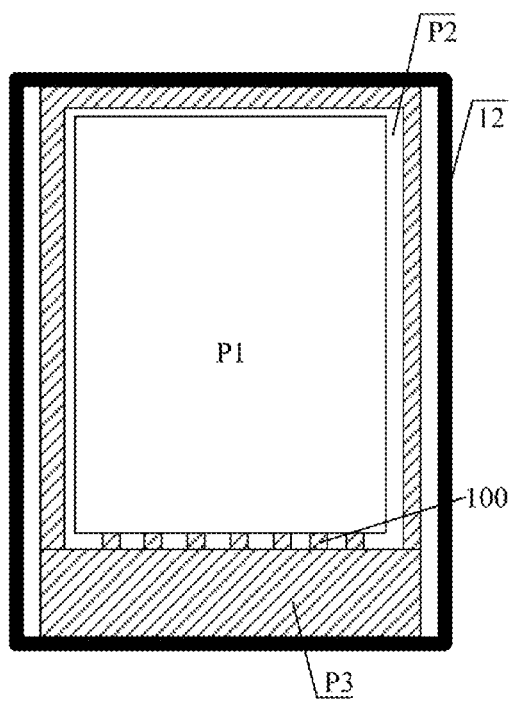
FIG. 20 is a top view of a display panel provided in the prior art.

FIG. 20 shows a display panel manufactured by a conventional technique, in which the power trace provided in the fan-out region P3 is a whole piece of power trace. In contrast to the power trace shown in FIG. 20, the plurality of vias 200 are provided in the first portion 20 of the first power trace provided in the fan-out region P3 shown in FIG. 1, which can reduce a reflective area of the power trace and lower a degree of reflection thereof, thereby improving the display effect.

In the embodiment shown in FIG. 2, the first portion 20 of the first power trace includes the sheet-shaped trace 210 and the plurality of strip-shaped traces 220 extending from the sheet-shaped trace 210 toward the display region P1. In this embodiment, the first portion 20 of the first power trace does not include the bus bar, and the plurality of transfer traces 100 and the plurality of strip-shaped traces 220 are in direct electrical connection with each other, as shown in FIG. 2. In addition, in one embodiment shown in FIG. 5, the distance between every two adjacent strip-shaped traces 220 is pitch a, and the length of each strip-shaped trace 220 is h. For example, the pitch a between every two adjacent strip-shaped traces 220 may be half to twice a pixel pitch (that is, when the plurality of pixels are periodically arranged in a plurality of rows and columns, each pixel pitch is a distance between every two adjacent columns of pixels). For example, if the distance between every two adjacent columns of pixels is 61.5 μm, a may be 61.5 μm as well, wherein a width of each strip-shaped trace may be 22 μm and the distance between every two strip-shaped traces may be selected to be 39.5 μm; and the length h may be selected according to a bonding tolerance required by the process, for example, the length h of each strip-shaped trace may range from 250 μm to 300 μm, for example, it may be 295 μm.

Figure 6A:
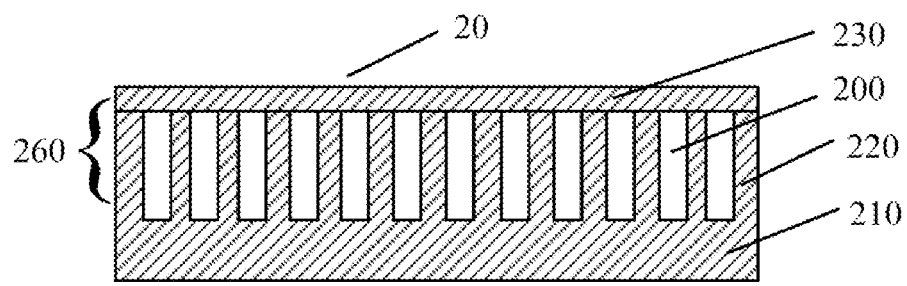
FIGS. 6A to 6C each are a top view of a first portion of a first power trace provided in one embodiment of the present disclosure.

In the embodiment shown in FIG. 3, the first portion 20 of the first power trace includes the sheet-shaped trace 210, the plurality of strip-shaped electrodes 220 extending from the sheet-shaped trace 210 toward the display region P1, and the bus bar 230 electrically connected to the plurality of strip-shaped electrodes 220. In contrast to the one shown in FIG. 1, the bus bar 230 in this embodiment is not integrally formed with the plurality of strip-shaped electrodes 220 and the sheet-shaped trace 210 as a single piece. For example, as shown in FIG. 6, the bus bar 230 may be separately formed, based on the formed first power trace shown in FIG. 2. In this embodiment, the first portion may also include the corner regions 280 shown in FIG. 1.

As shown in FIG. 4, the first portion 20 of the first power trace is located in the non-display region P2, an orthographic projection of the first portion 20 of the first power trace on the substrate 10 is located in the fan-out region P3, and the first portion 20 of the first power trace is connected to the display region P1 through the transfer trace 100 included in the first portion 20.

As shown in FIG. 4, the substrate 10 bends; and the display panel further includes: a support layer 11 provided on one side of the substrate 10 distal to the first power trace, and a light shielding layer (for example, ink 12) configured to cover the non-display region when the cover plate is bonded onto the display panel. As shown in FIGS. 1 to 4, for the sake of preventing the ink 20 from entering the display region P1, there is a certain gap between the ink 12 and the display region P1, such that the first portion 20 of the first power trace is not covered by the ink, that is, the plurality of transfer traces 100 and the first portion 20 of the first power trace are provided in the gap region between the ink 20 and the display region P1.

Figure 8:
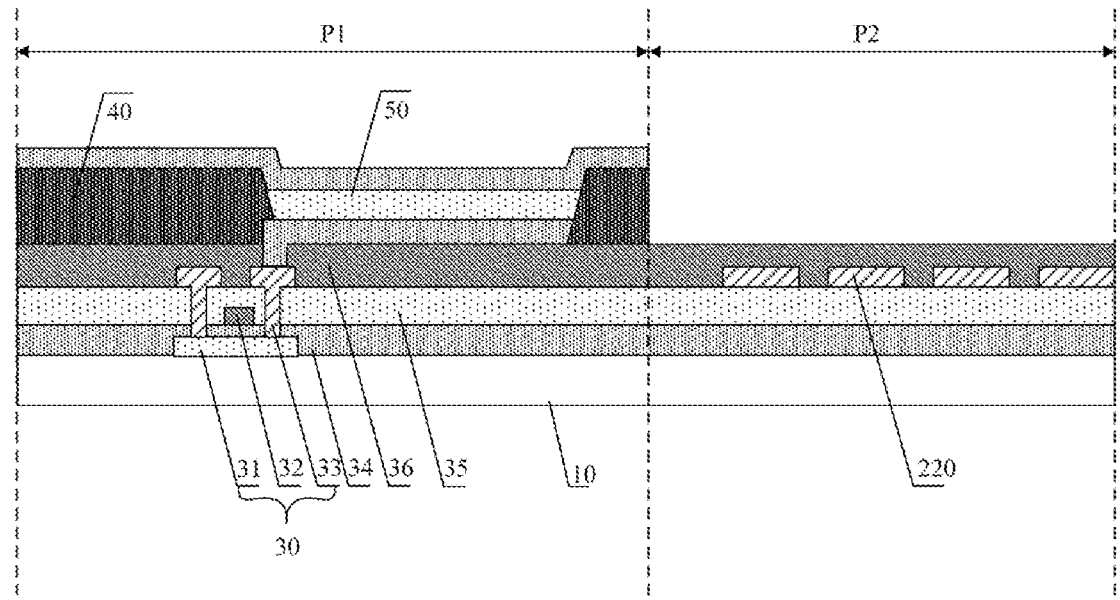
FIG. 8 is a sectional view of a display panel provided in one embodiment of the present disclosure, including a section in a non-display region taken along a line A-A in FIG. 7.

In one exemplary embodiment, as shown in FIG. 8, the display panel may further include a thin-film transistor 30, a pixel definition layer 40 and a light-emitting device layer 50 which are located in the display region, and the thin-film transistor 30 includes an active layer 31, a gate electrode 32, and source and drain electrodes 33. The thin-film transistor may be a top gate structure or a bottom gate structure. FIG. 8 illustrates an example in which the thin-film transistor is a top gate structure.

In one embodiment, the display panel may further include a gate insulation layer 34, an interlayer insulation layer 35 and an insulation layer 36, wherein the insulation layer 36 includes a passivation layer and a planarization layer.

In one embodiment, the light-emitting device layer 50 includes an anode connected with a source or a drain of the thin film transistor, a light-emitting material layer provided on the anode, and a cathode provided on the light-emitting material layer.

In one embodiment, the display panel may be an Organic Light-Emitting Diode (OLED) display panel or a Quantum Dot Light Emitting Diode (QLED) display panel.

In one embodiment, the fan-out region is located on one side of the display panel distal to a camera and an earpiece.

In one embodiment, the substrate 10 may be a flexible substrate, wherein the flexible substrate may be, but not limited to, one or more of polyethylene terephthalate, ethylene terephthalate, polyether ether ketone, polystyrene, polycarbonate, polyarylate, polyimide, polyvinyl chloride, polyethylene, and textile fiber.

A direction perpendicular to the substrate refers to a direction along which the first power trace is stacked on the substrate.

In one embodiment, the specific number of the vias 200 provided in the first portion 20 of the first power trace is determined according to actual conditions. The larger the number of the vias 200 is, the larger the number of the strip-shaped traces 220 will become, and the smaller the reflective area of the first portion of the first power trace will become.

In one embodiment, a material used for preparing the first power trace may be metal, for example, silver or aluminum, so as to ensure the conductivity of the first power trace. For example, the first power trace may be a film layer made of Ti/Al/Ti.

A display panel provided in some embodiments of the present disclosure is divided into a display region and a non-display region at least partially surrounding the display region; a fan-out region is provided in the non-display region; the display panel includes a substrate and a first power trace provided on the substrate; a first portion of the first power trace is provided in the fan-out region and configured to transmit a first power signal; and the first portion of the first power trace includes a sheet-shaped trace proximal to an edge of the display panel, and a plurality of strip-shaped traces spaced apart from one another and extending from the sheet-shaped trace toward the display region. According to the present disclosure, the plurality of strip-shaped traces spaced apart from one another are formed by providing a plurality of vias in the first portion of the first power trace in the non-display region, which can reduce the reflective area of the power trace and lower the degree of reflection thereof, thereby improving the display effect.

Figure 5:
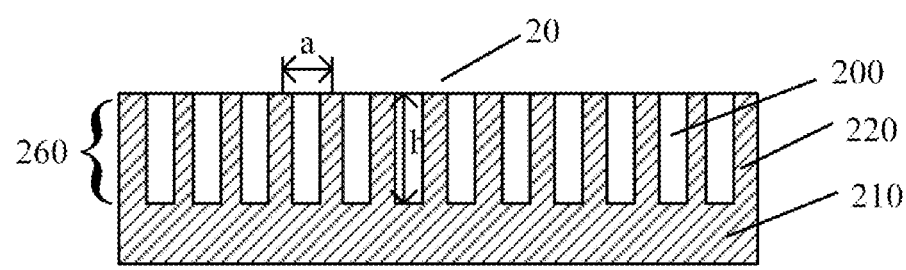
FIG. 5 is a top view of a first portion of a first power trace provided in one embodiment of the present disclosure.

FIGS. 5 to 7 show that the plurality of strip-shaped traces are periodically arranged along a predetermined direction. In other words, a plurality of openings spaced apart from one another are formed in a single metal layer; the plurality of openings are also periodically arranged along the predetermined direction; the predetermined direction may be, for example, parallel or substantially parallel to an edge of the display region proximal to the first power trace; and the plurality of strip-shaped traces and the plurality of openings extend along, for example, a direction perpendicular to the predetermined direction. Where the display region includes a plurality of pixel units arranged in a plurality of rows and columns, the predetermined direction is, for example, an extending direction of the plurality of rows of pixel units.

In one embodiment, the display panel further includes a signal trace located in the non-display region and provided in a same layer as the gate electrode of the thin-film transistor, there is an overlapping region between respective orthographic projections of the signal trace and the first power trace on the substrate, and the interlayer insulation layer is located between the signal trace and the first power trace, wherein an extending direction of the signal trace is perpendicular to or crosses over that of the first power trace.

Figure 6B:
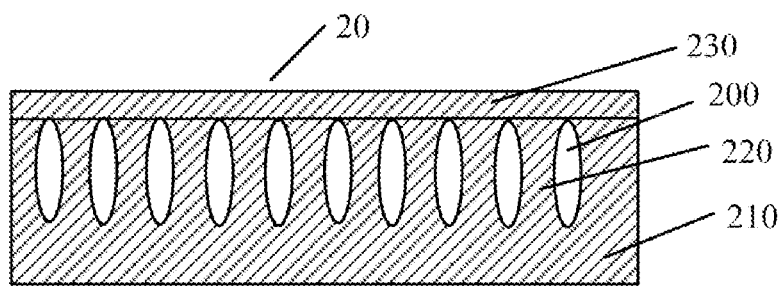
Figure 6C:
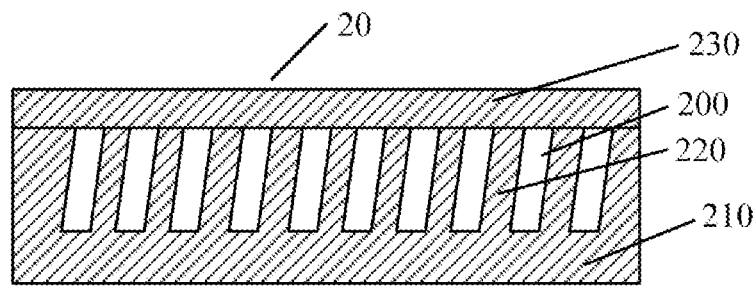

In one embodiment, a shape of an orthographic projection of the via 200 on the substrate 10 may be a rectangle, or the shape of the orthographic projection of the via 200 on the substrate 10 may be a circle, an ellipse, a rhombus or the like. For example, where the shape of the orthographic projection of the via 200 on the substrate 10 is a circle or an ellipse, two end portions of the formed strip-shaped trace 220 respectively connected with the sheet-shaped trace 210 and the bus bar 230 are wider than a middle portion of the formed strip-shape trace 220, as shown in FIG. 6B; where the shape of the orthographic projection of the via 200 on the substrate 10 is a parallelogram, the formed strip-shaped trace 220 is inclined at a certain angle with respect to an edge of the display region P1, as shown in FIG. 6C.

FIGS. 1 to 7 show a display panel according to some embodiments of the present disclosure, and the display panel includes a substrate and a first power trace provided on the substrate; a first portion of the first power trace is provided in the fan-out region and configured to transmit a first power signal; and the first portion of the first power trace includes a sheet-shaped trace proximal to an edge of the display panel and a plurality of strip-shaped traces spaced apart from one another and extending from the sheet-shaped trace toward the display region. According to the present disclosure, the plurality of strip-shaped traces spaced apart from one another are formed by providing a plurality of vias in the first portion of the first power trace in the non-display region, which can reduce the reflective area of the power trace and lower the degree of reflection thereof, thereby improving the display effect. In other words, the first portion of the first power trace according to the present disclosure includes the sheet-shaped trace and a first sub-portion extending from the sheet-shaped trace toward the display region, within a unit area, an area of an orthographic projection of the first sub-portion on the substrate is smaller than that of the sheet-shaped trace on the substrate, and based on this, the reflective area of the power trace can be reduced and the degree of reflection of the power trace can be lowered, thereby improving the display effect. For example, as shown in FIG. 5, the first portion 20 of the first power trace includes the sheet-shaped trace 210 and the first sub-portion 260 extending from the sheet-shaped trace toward the display region. Within a unit area, the area of the orthographic projection of the first sub-portion 260 on the substrate is smaller than that of the sheet-shaped trace on the substrate. For example, the first sub-portion 260 shown in FIG. 5 includes the plurality of strip-shaped traces 220 spaced apart from one another, and the first sub-portion 260 shown in FIG. 6A includes the plurality of strip-shaped traces 220 spaced apart from one another, the bus bar 230 and the like.

Figure 9:
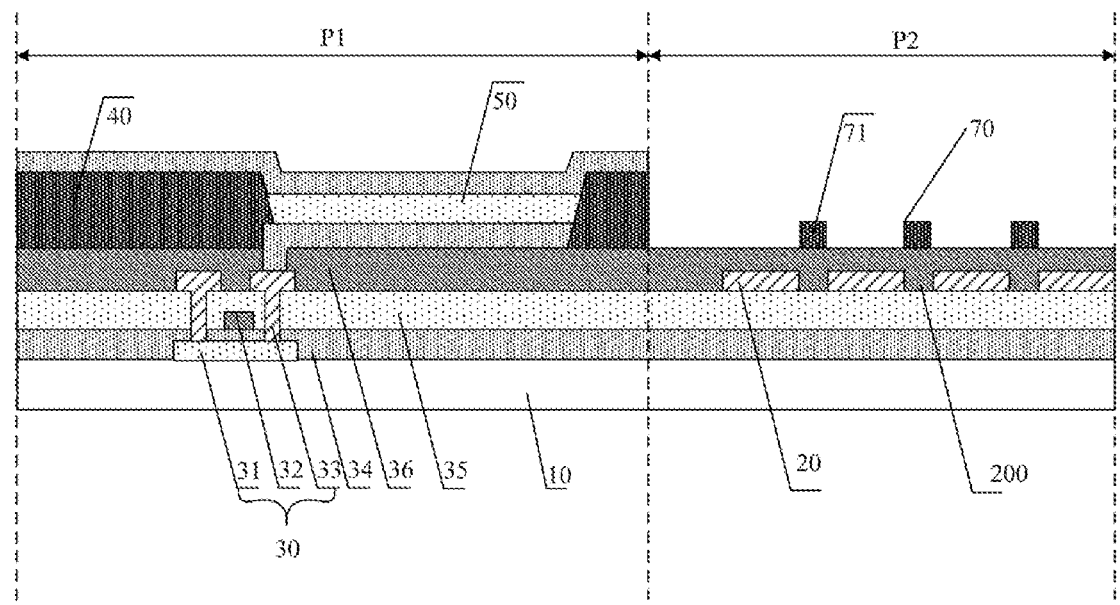
FIG. 9 is a sectional view of a display panel provided in one embodiment of the present disclosure.
Figure 10:
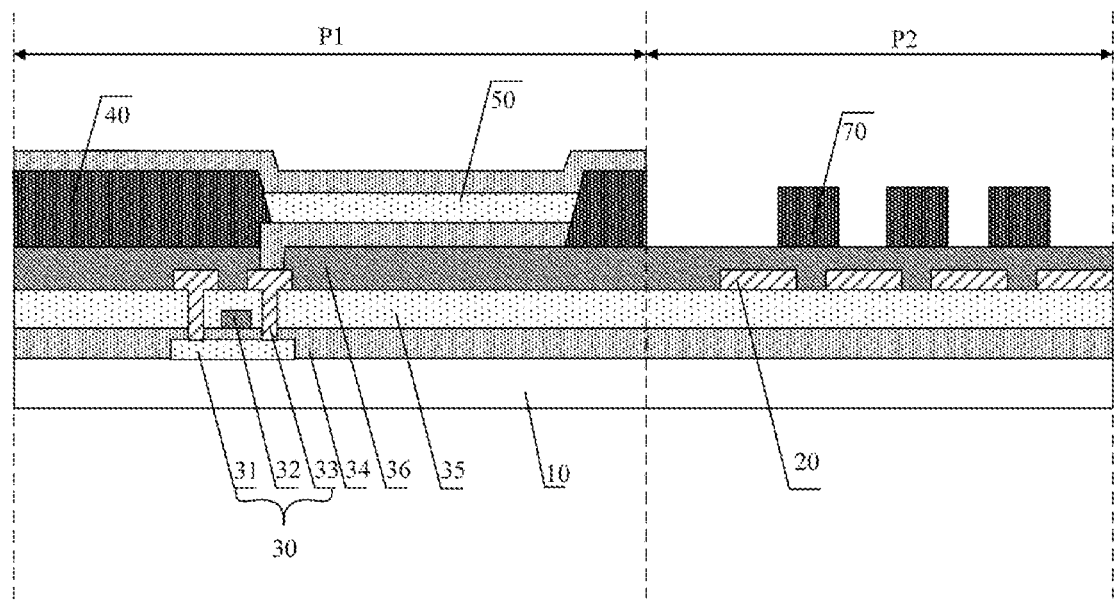
FIG. 10 is a sectional view of a display panel provided in one embodiment of the present disclosure.
Figure 11:
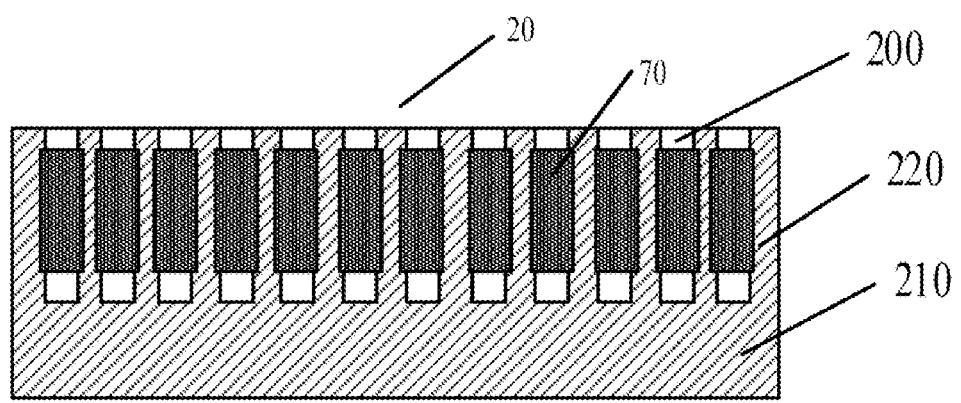
FIG. 11 is a top view of a first portion of a first power trace of a display panel and a light absorbing layer formed on top of the first portion provided in one embodiment of the present disclosure.
Figure 12:
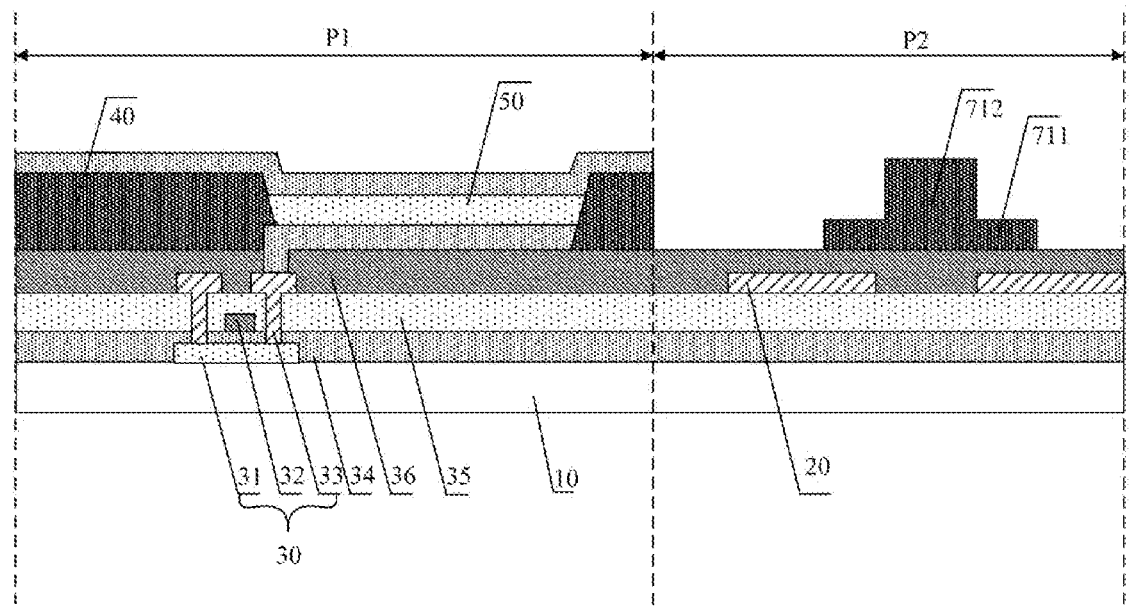
FIG. 12 is a sectional view of a display panel provided in one embodiment of the present disclosure.
Figure 13:
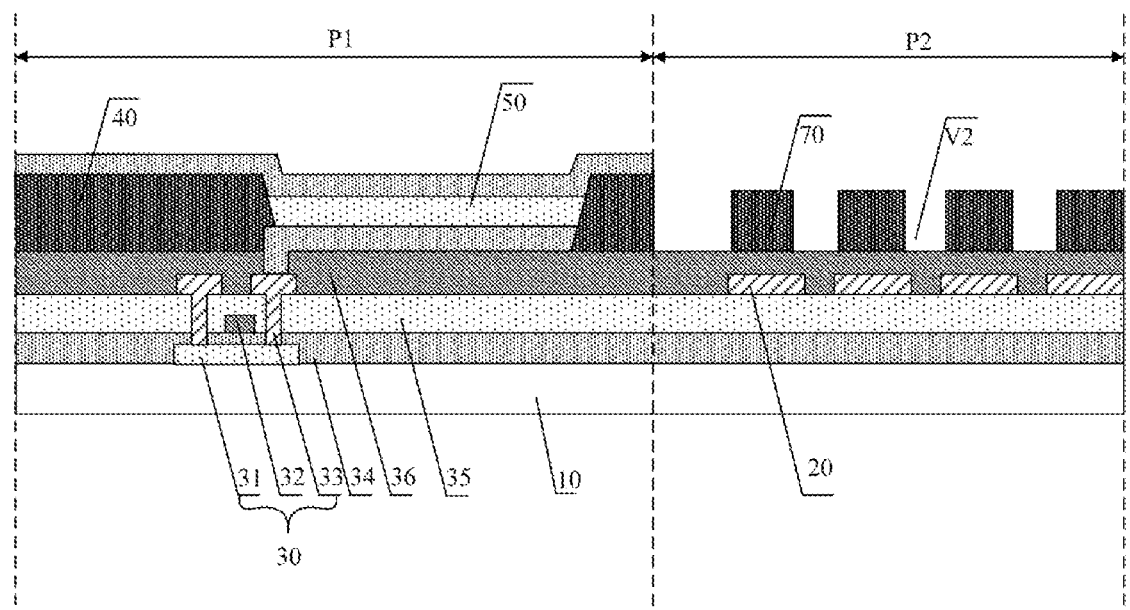
FIG. 13 is a sectional view of a display panel provided in one embodiment of the present disclosure.

FIG. 9 is a sectional view of a display panel provided in one embodiment of the present disclosure; FIG. 10 is a sectional view of a display panel provided in one embodiment of the present disclosure; FIG. 11 is a top view of a display panel provided in one embodiment of the present disclosure; FIG. 12 is a sectional view of a display panel provided in one embodiment of the present disclosure; and FIG. 13 is a sectional view of a display panel provided in one embodiment of the present disclosure. In these embodiments, the display panel further includes a light absorbing layer 70 in the non-display region P2, and the insulation layer 36 is located between the light absorbing layer 70 and the first portion 20 of the first power trace.

The first power trace is provided in a same layer as the source and drain electrodes 33 of the thin-film transistor; and the light absorbing layer 70 is provided in a same layer as the pixel definition layer 40 and configured to absorb light reflected by the first portion 20 of the first power trace.

In one embodiment of the present disclosure, a thickness of the light absorbing layer 70 may be 1.5 to 3 μm, a material used for preparing the light absorbing layer 70 may be photosensitive resin, and the photosensitive resin includes photoresist, polyimide or polytetrafluoroethylene.

The light absorbing layer included in the display panel provided in some embodiments of the present disclosure can lower the degree of reflection of the first power trace to a greater extent, thereby ensuring the display effect of the display panel, wherein the degree of reflection of the display panel with the light absorbing layer as well as a plurality of first vias is higher than that of the display panel with the plurality of first vias only.

In one embodiment, the light absorbing layer includes a plurality of light absorbing structures; and each of the plurality of light absorbing structures corresponds to a respective one of the plurality of vias 200.

In one embodiment of the present disclosure, a shape of a cross section of the light absorbing structure may be the same as or different from that of the corresponding via, and the shape of the cross section of the light absorbing structure may be a rectangle, a circle, an ellipse or a rhombus.

In one exemplary embodiment, an orthographic projection of the light absorbing structure 71 on the substrate 10 coincides with that of the corresponding via 200 on the substrate 10, as shown in FIG. 9. FIG. 9 illustrates an example in which the shape of the cross section of the light absorbing structure is the same as that of the corresponding via.

In FIG. 10, the orthographic projection of the light absorbing structure 71 on the substrate 10 covers that of the via 200 on the substrate 10. FIG. 11 shows a top view of the first power trace in FIG. 10, in which a length of a long side of the via 200 is greater than a length of the corresponding light absorbing structure along an extending direction of the long side of the via 200, and a length of a short side of the via 200 is smaller than a length of the corresponding light absorbing structure along an extending direction of the short side of the via 200.

FIG. 12 is a sectional view of a display panel provided in one embodiment of the present disclosure. In this embodiment, the orthographic projection of the light absorbing structure 71 on the substrate covers that of the corresponding via on the substrate.

The light absorbing structure 71 shown in FIG. 12 includes a first light absorbing portion 711 and a second light absorbing portion 712 that are integrally formed as a single piece, and the first light absorbing portion 711 is located on one side of the second light absorbing portion 712 proximal to the first power trace 20. An orthographic projection of the first light absorbing structure 711 on the substrate coincides with that of the corresponding first via on the substrate, and there is an overlapping region between respective orthographic projections of the second light absorbing structure 712 and the corresponding first via on the substrate.

In one exemplary embodiment, a length of a long side of a via is smaller than a length of the second light absorbing portion of the corresponding light absorbing structure along an extending direction of the long side of the via, and a length of a short side of a via is greater than a length of the second light absorbing portion of the corresponding light absorbing structure along an extending direction of the short side of the via.

FIG. 13 is a sectional view of a display panel provided in one embodiment of the present disclosure. In this embodiment, each of a plurality of vias V2 in the light absorbing layer 70 corresponds to a respective one of the plurality of vias 200.

In one embodiment, an orthographic projection of the via V2 on the substrate coincides with that of the corresponding via 200 on the substrate. In one embodiment, there is an overlapping region between respective orthographic projections of the via V2 and the corresponding via 200 on the substrate.

In one exemplary embodiment, the length of the long side of the via 200 is greater than the length of the corresponding via V2 along an extending direction of the long side of the via 200, and the length of the short side of the via 200 is smaller than the length of the corresponding via V2 along an extending direction of the short side of the via 200.

Some embodiments of the present disclosure further provide a display apparatus including a display panel.

The display panel is the same as the display panel provided in the foregoing embodiments; and principles to realize them and effects achieved by them are similar, and will not be repeated herein.

The display apparatus may further include a cover plate, which is bonded onto the display panel, and edges of which are provided with ink to cover the non-display region; and at least a portion of the first power trace is not covered by the ink.

In addition, the display panel further includes a second power trace, which is provided in the fan-out region P3 and located at a position distal to the display region P1 with respect to the first power trace; and the light shielding layer at least partially covers the second power trace. As shown in FIG. 4, the second power trace 80 is covered by the ink 20.

In some embodiments of the present disclosure, the display apparatus may be a product or component having a display function, such as a mobile phone, a tablet computer, a television, a monitor, a notebook computer, a digital photo frame, or a navigator. It will be understood by a person skilled in the art that the display apparatus should have other necessary elements, which will not be repeated herein and should not be construed as limitations on the present disclosure.

Figure 14:
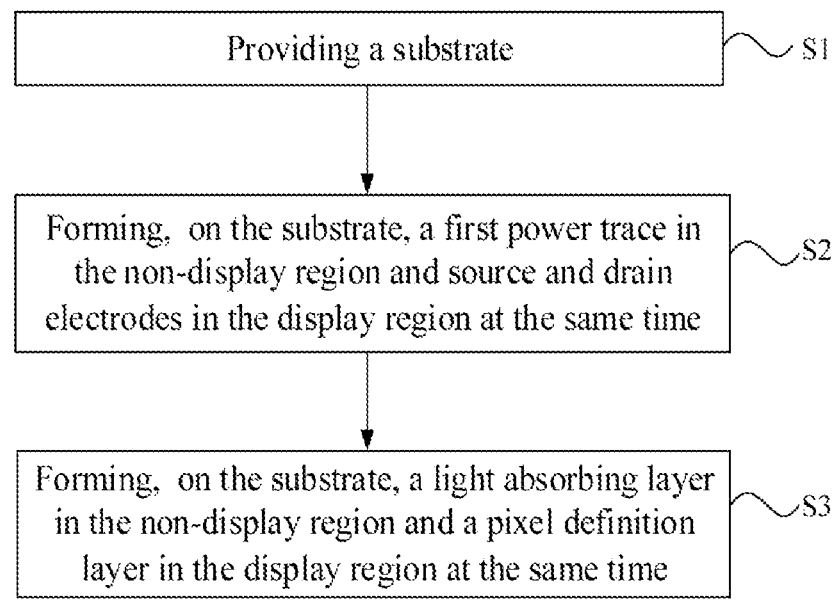
FIG. 14 is a flow diagram of a method for manufacturing a display panel provided in one embodiment of the present disclosure.

FIG. 14 is a flow diagram of a method for manufacturing a display panel provided in one embodiment of the present disclosure. As shown in FIG. 14, this embodiment of the present disclosure further provides a method for manufacturing a display panel, which is divided into a display region and a non-display region surrounding the display region and provided with a fan-out region. The method for manufacturing the display panel provided therein includes the following steps:

Step S1: providing a substrate.

In one embodiment, the substrate may be a flexible substrate, wherein the flexible substrate may be, but not limited to, one or more of polyethylene terephthalate, ethylene terephthalate, polyether ether ketone, polystyrene, polycarbonate, polyarylate, polyimide, polyvinyl chloride, polyethylene, and textile fiber.

Step S2: forming, on the substrate, a first power trace located in a non-display region.

An orthographic projection of the first power trace on the substrate is located in a fan-out region, and the first power trace is provided with a plurality of vias along a direction perpendicular to the substrate, such that the first power trace includes a plurality of strip-shaped traces parallel to one other.

The display panel is the same as the display panel provided in the foregoing embodiments; and principles to realize them and effects achieved by them are similar, and will not be repeated herein.

In one exemplary embodiment, Step S2 includes: forming, on the substrate, source and drain electrodes of a thin-film transistor in a display region and the first power trace in the non-display region using a single process.

In one exemplary embodiment, the method for manufacturing the display panel further includes Step S3 subsequent to Step S2 and including: forming, on one side of the first power trace distal to the substrate, a pixel definition layer in the display region and a light absorbing layer in the non-display region using a single process.

Hereinafter, referring to FIGS. 15 and 16, a technical solution provided in one exemplary embodiment will be described in view of a preparing process of the display panel.

Figure 15:
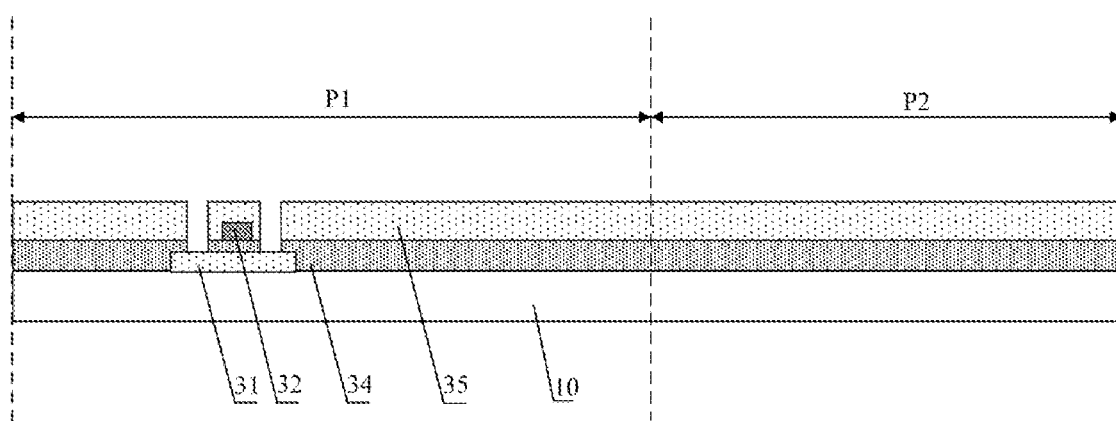
FIG. 15 is a schematic diagram of a method for manufacturing a display panel provided in one embodiment of the present disclosure.
Figure 16:
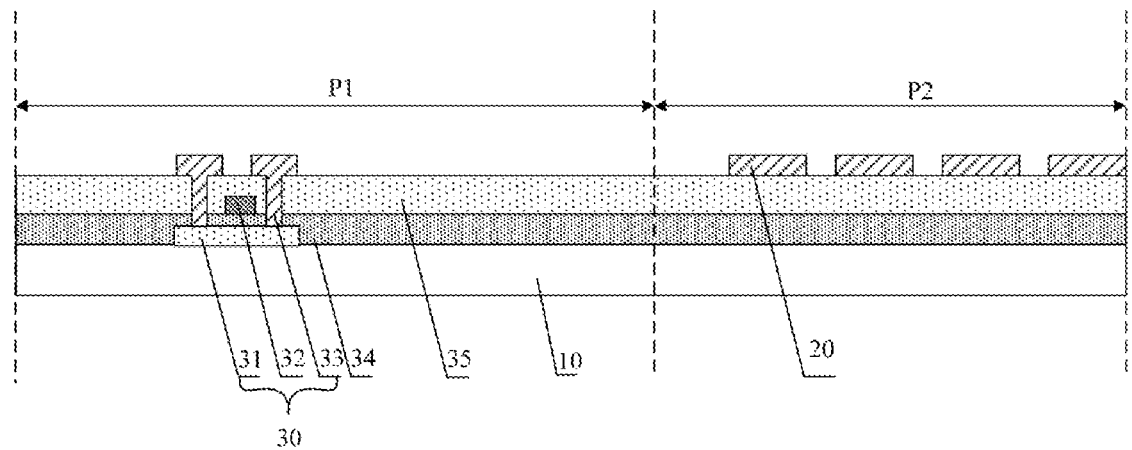
FIG. 16 is a schematic diagram of a method for manufacturing a display panel provided in one embodiment of the present disclosure.

Step 100: providing a substrate 10, and forming, on the substrate 10, an active layer 31, a gate insulation layer 34, a gate electrode 32 and an interlayer insulation layer 35 of a thin-film transistor in succession, as shown in FIG. 15;

Step 200: forming, on the interlayer insulation layer 35, source and drain electrodes 33 of the thin-film transistor in a display region P1 and a first portion 20 of a first power trace in a non-display region P2, as shown in FIG. 16; and Step 300: forming an insulation layer 36 on the source and drain electrodes 33, and forming, on the insulation layer 36, a pixel definition layer 40 in the display region and a light absorbing layer 70 in the non-display region, as shown in FIGS. 8-10 and 12-13.

Figure 17:
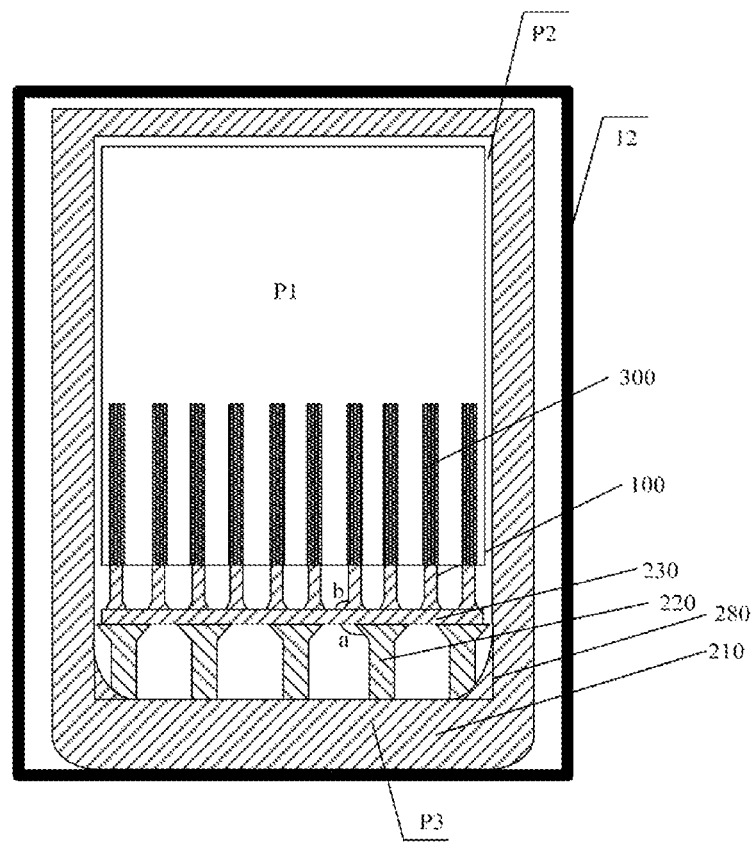
FIG. 17 is a top view of a display panel provided in one embodiment of the present disclosure.

FIG. 17 shows a top view of a display panel provided in one embodiment of the present disclosure. The display panel in the embodiment of the present disclosure is divided into a display region P1 and a non-display region P2 surrounding the display region P1; a fan-out region P3 is provided in the non-display region P2; the display panel includes a substrate 10 and a first power trace provided on the substrate 10; and a first portion 20 of the first power trace is provided in the fan-out region P3 and configured to transmit a first power signal, for example, a power signal VDD in the display panel. The first power trace is typically a film layer made of Ti/Al/Ti. The first portion includes a sheet-shaped trace 210 proximal to an edge of the display panel, a plurality of strip-shaped traces 220 spaced apart from one another and extending from the sheet-shaped trace 210 toward the display region P1, and a bus bar 230 electrically connected with the plurality of strip-shaped traces 220. In this embodiment, the sheet-shaped trace 210, the plurality of strip-shaped traces 220 and the bus bar 230 may be integrally formed as a single piece, that is, may be prepared from a single piece of metal material using a patterning process. For example, the first portion 20 may be formed by forming a plurality of vias 200 in a single metal material layer using the patterning process.

As shown in this figure, the display panel further includes a plurality of transfer traces 100, which are provided in the fan-out region P3, electrically connected with the bus bar 230, and configured to transfer a first power supply to each column of pixel units in the display region P1, respectively. For example, when the display region P1 includes a plurality of pixel units arranged in a plurality of rows and columns, each of the plurality of transfer traces 100 is electrically connected to a first power signal line 300 of a respective column of pixel units, and configured to provide the first power supply to this column of pixel units.

In one embodiment, the sheet-shaped trace 210, the plurality of strip-shaped traces 220, the bus bar 230 and the plurality of transfer traces 100 may be integrally formed as a single piece, that is, may be prepared from a single piece of metal material using a patterning process.

As shown in FIG. 17, respective lengths of the strip-shaped traces in corner regions 280 in the first portion of the first power trace of the display panel are shorter than those of the strip-shaped electrode traces in a region other than the corner regions 280. This is because the corner regions will be covered by a frame of the display panel and they will not cause any reflection.

In one embodiment, at least one strip-shaped trace of the plurality of strip-shaped traces 220 includes a first end portion adjacent to the bus bar 230, and an area of an orthographic projection of the first end portion on the bus bar 230 becomes larger as the first end approaches the bus bar 230. In one embodiment, at least one strip-shaped trace of the plurality of transfer traces 100 includes a second end portion adjacent to the bus bar 230, and an area of an orthographic projection of the second end portion on the bus bar 230 becomes larger as the second end portion approaches the bus bar 230.

As shown in FIG. 17, a first oblique angle between the first end portion of the strip-shaped trace 220 and the bus bar 230 is a, and a second oblique angle between the second end portion of the transfer trace 100 and the bus bar 230 is b, and in this embodiment, the first oblique angle is greater than the second oblique angle. However, the present disclosure is not limited to this, and the first oblique angle a may alternatively be configured to be less than the second oblique angle b. For example, an absolute value of an angle difference between the first oblique angle and the second oblique angle is less than 30°, for example, the absolute value of the angle difference may be 10°, 15°, 20°, 25°, etc.

In one embodiment, the sheet-shaped trace 210, the plurality of strip-shaped traces 220, the bus bar 230, the plurality of transfer traces 100, the corner regions 280 in the first portion of the first power trace, and a plurality of first power signal lines 300 may be integrally formed as a single piece, that is, may be prepared from a single piece of metal material using a patterning process. However, the present disclosure is not limited to this, and any two or more of the sheet-shaped trace 210, the plurality of strip-shaped traces 220, the bus bar 230, the plurality of transfer traces 100, the corner regions 280 in the first portion of the first power trace, and the plurality of first power signal lines 300 may be configured to form an integral structure from a single piece of metal using the same patterning process, that is, the plurality of first power signal lines directly extend from the display region P1 to form an integral structure with the plurality of transfer traces 100, the bus bar 230, the plurality of strip-shaped traces 220 and the sheet-shaped trace 210, and the integral structure, for example, may be located in a region where a pixel driver circuit is located In one embodiment, the sheet-shaped trace 210, the plurality of strip-shaped traces 220, the bus bar 230, the plurality of transfer traces 100, the first power trace and the plurality of first power signal lines may be arranged in a same layer. However, the present disclosure is not limited to this, and as long as power supply can be realized, any two or more of the sheet-shaped trace 210, the plurality of strip-shaped traces 220, the bus bar 230, the plurality of transfer traces 100, the first power trace and the plurality of first power signal lines may be arranged in different layers.

Figure 18:
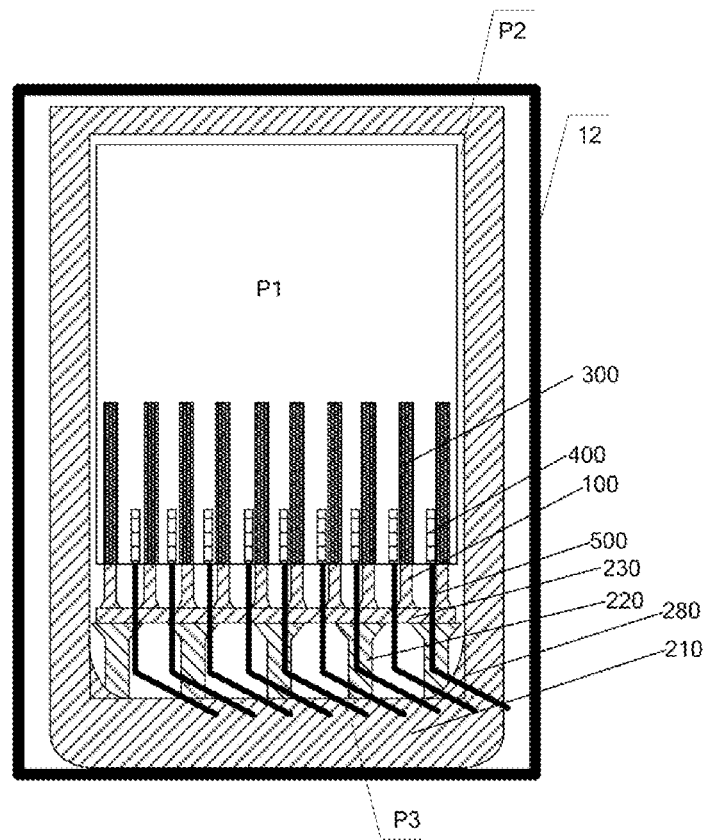
FIG. 18 is a top view of a display panel provided in one embodiment of the present disclosure.

FIG. 18 shows a top view of a display panel provided in one embodiment of the present disclosure. In addition to the configuration shown in FIG. 17, a plurality of data lines 400 are provided in the display region, and a plurality of corresponding data line leads 500 are provided in the fan-out region. In this embodiment, the plurality of data lines 400 and the plurality of first power signal lines 300 of the plurality of the pixel units are typically arranged in different layers, and orthographic projections of the plurality of data lines 400 on the substrate 10 are located between orthographic projections of the plurality of first power signal lines 300 of the plurality of columns of pixel units on the substrate, respectively; and the plurality of data lines 400 are connected to a data signal line through the plurality of data line leads 500, respectively. Orthographic projections of the plurality of data line leads 500 on the substrate partially overlap with orthographic projections of the plurality of strip-shaped traces 220 and the sheet-shaped trace 210 on the substrate.

According to the present disclosure, the corners of the first portion 20 of the first power trace located in the non-display region P2 and distal to the edge of the display region P1 are not limited to right-angle corners shown in FIGS. 1-3, 5-7 and 11. For example, as shown in FIGS. 17 and 18, the corners of the first power trace proximal to the sheet-shaped trace 210 are rounded corners. However, the present disclosure is not limited to this.

Figure 19A:
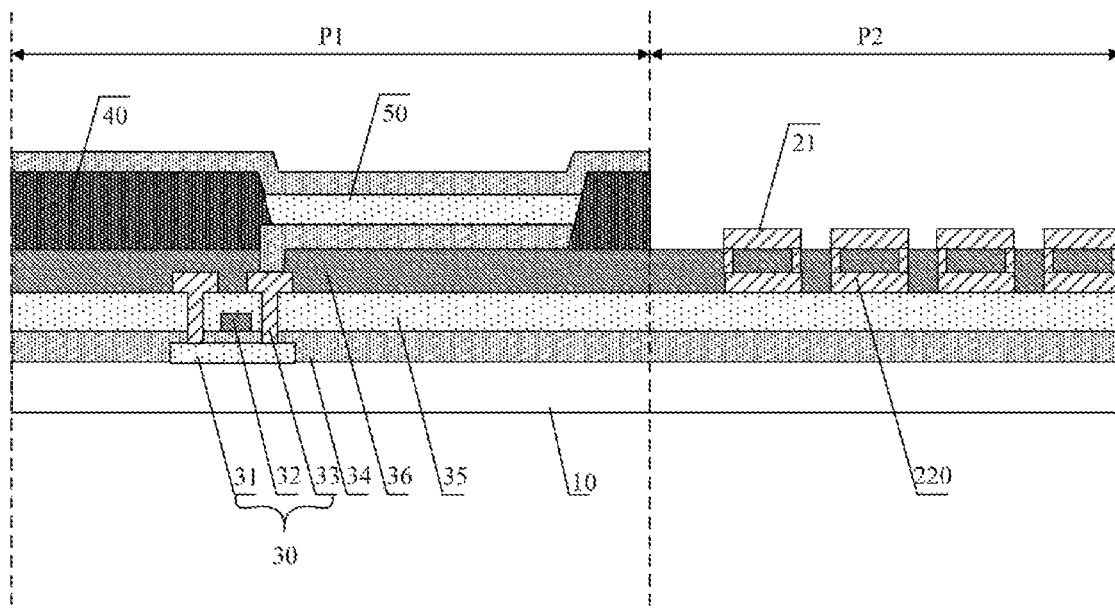
FIGS. 19A and 19B each are a sectional view of a display panel provided in one embodiment of the present disclosure.
Figure 19B:
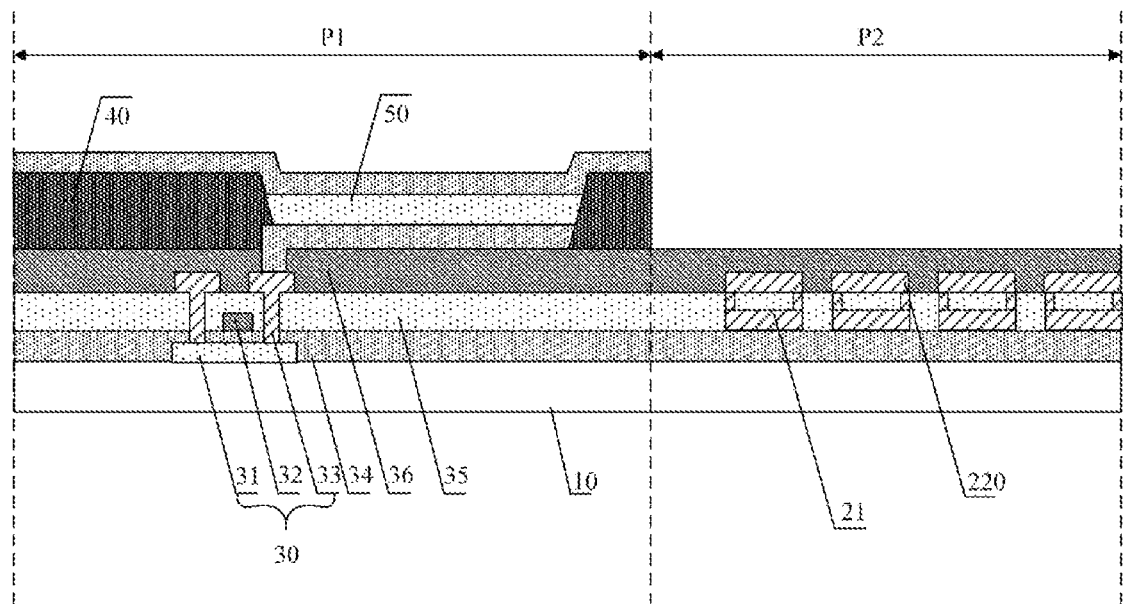

For the sake of reducing resistance of the sheet-shaped trace 210, the plurality of strip-shaped traces 220, the bus bar 230, the plurality of transfer traces 100 and the corner regions 280, an additional metal film layer may be provided above or below a corresponding metal film layer and connected with the corresponding metal film layer in parallel. For example, as shown in FIG. 19A, an additional metal layer 21 is provided above the strip-shaped trace 220 and connected with the strip-shaped trace 220 in parallel.

The drawings for the embodiments of the present disclosure are only directed to the structures related in the embodiments, and for other structures, please refer to conventional designs.

In the drawings for illustrating the embodiments of the present disclosure, the thickness and size of layers or microstructures are magnified for clarity. It will be understood that when an element such as a layer, film, region, or substrate is referred to as being "on" or "under" another element, it may be directly "on" or "under" the other element, or intervening elements may also be present.

Although the embodiments of the present disclosure have been described hereinbefore, the described embodiments are used for facilitating the understanding of the present disclosure only, but are not intended to limit the present disclosure. A person skilled in the art may make any changes and modifications to the embodiments in form and detail without departing from the spirit and scope of the present disclosure, but the protection scope of the present disclosure is still subject to the scope defined by the appended claims.

What is claimed is:

1. A display panel, wherein the display panel comprises a display region and a non-display region at least partially surrounding the display region, the non-display region is provided with a fan-out region, the display panel comprises a substrate and a first power trace provided on the substrate, and the first power trace comprises a first portion provided in the fan-out region; the first portion comprises a sheet-shaped trace proximal to an edge of the display panel and a first sub-portion extending from the sheet-shaped trace toward the display region; and within a unit area, an area of an orthographic projection of the first sub-portion on the substrate is smaller than an area of an orthographic projection of the sheet-shaped trace on the substrate;

the first sub-portion comprises a plurality of strip-shaped traces spaced apart from one another;

the first portion further comprises a bus bar provided on one side of the plurality of strip-shaped traces distal to the sheet-shaped trace, and the plurality of strip-shaped traces each are connected to the bus bar; and at least one strip-shaped trace of the plurality of strip-shaped traces comprises a first end portion adjacent to the bus bar, and an area of an orthographic projection of the first end portion on the bus bar becomes larger as the first end portion approaches the bus bar.

2. The display panel according to claim 1, wherein the display region comprises a plurality of pixel units;

the display panel further comprises a plurality of transfer traces electrically connected between the plurality of strip-shaped traces and the plurality of pixel units, and the plurality of transfer traces are provided in the fan-out region.

3. The display panel according to claim 2, wherein the plurality of pixel units comprises a plurality of pixel units arranged in a plurality of rows and columns; and each transfer trace of the plurality of transfer traces is electrically connected with a first power signal line of a respective column of pixel units of a plurality of columns of pixel units.

4. The display panel according to claim 3, wherein parts of the plurality of transfer traces distal to the display region each are electrically connected to the bus bar.

5. The display panel according to claim 4, wherein at least one transfer trace of the plurality of transfer traces comprises a second end portion adjacent to the bus bar, and an area of an orthographic projection of the second end portion on the bus bar becomes larger as the second end portion approaches the bus bar.

6. The display panel according to claim 5, wherein a first oblique angle is formed between the first end portion of the strip-shaped trace and the bus bar;

a second oblique angle is formed between the transfer trace and the bus bar; and an absolute value of an angle difference between the first oblique angle and the second oblique angle is less than 30°.

7. The display panel according to claim 4, wherein a distance between every two adjacent strip-shaped traces of the plurality of strip-shaped traces is a distance between respective center lines of the two adjacent strip-shaped traces, and a difference between a maximum and a minimum of distances between all two adjacent strip-shaped traces of the plurality of strip-shaped traces is no more than 10 μm.

8. The display panel according to claim 4, wherein a distance between at least two adjacent strip-shaped traces of the plurality of strip-shaped traces is within a range from half a distance between at least two adjacent columns of pixel units among the plurality of pixel units arranged in the plurality of rows and columns to twice the distance between the at least two adjacent columns of pixel units.

9. The display panel according to claim 3, wherein the display region further comprises a plurality of data lines, and the fan-out region further comprises a plurality of data line leads;
- orthographic projections of the plurality of data lines on the substrate are located between orthographic projections of a plurality of first power signal lines of the plurality of columns of pixel units on the substrate, respectively;
- the plurality of data lines are connected to a data signal line through the plurality of data line leads, respectively; and
- orthographic projections of the plurality of data line leads on the substrate partially overlap with orthographic projections of the plurality of strip-shaped traces and the sheet-shaped trace on the substrate.

10. The display panel according to claim 1, wherein the substrate is flexible.

11. A method for manufacturing the display panel according to claim 1, comprising:
- forming, on the substrate, the first power trace configured to transmit a first power signal, such that the first portion of the first power trace is provided in the fan-out region, and the first portion comprises the sheet-shaped trace proximal to an edge of the display panel and a plurality of strip-shaped traces spaced apart from one another and extending from the sheet-shaped trace toward the display region.

12. The method according to claim 11, further comprising: forming, in the fan-out region of the substrate, a plurality of transfer traces electrically connected with the first portion, the plurality of transfer traces being configured to be electrically connected with a plurality of pixel units of the display panel.

13. A display apparatus comprising:
the display panel according to claim 1; and
a cover plate, which is adhered onto the display panel, and edges of which are provided with a light shielding layer to cover the non-display region,
wherein at least a portion of the first portion of the first power trace is not covered by the light shielding layer.

14. The display apparatus according to claim 13, further comprising a second power trace provided in the fan-out region and located at a position distal to the display region with respect to the first power trace, wherein
the light shielding layer at least partially covers the second power trace.

15. The display apparatus according to claim 13, wherein the display region comprises a plurality of pixel units;
- the display panel further comprises a plurality of transfer traces electrically connected between the plurality of strip-shaped traces and the plurality of pixel units, and
- the plurality of transfer traces are provided in the fan-out region.

16. The display apparatus according to claim 15, wherein
- the plurality of pixel units comprises a plurality of pixel units arranged in a plurality of rows and columns; and
- each transfer trace of the plurality of transfer traces is electrically connected with a first power signal line of a respective column of pixel units of a plurality of columns of pixel units.

17. The display apparatus according to claim 16, wherein parts of the plurality of transfer traces distal to the display region each are electrically connected to the bus bar.

18. The display apparatus according to claim 17, wherein at least one transfer trace of the plurality of transfer traces comprises a second end portion adjacent to the bus bar, and an area of an orthographic projection of the second end portion on the bus bar becomes larger as the second end portion approaches the bus bar.

* * * * *